(12) United States Patent
Alzheimer

(10) Patent No.: US 12,198,774 B2
(45) Date of Patent: Jan. 14, 2025

(54) MEMORY DEVICE SIDEBAND SYSTEMS AND METHODS

(71) Applicant: Micron Technology, Inc., Boise, ID (US)

(72) Inventor: Joshua E. Alzheimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/710,601

(22) Filed: Mar. 31, 2022

(65) Prior Publication Data

US 2023/0317193 A1 Oct. 5, 2023

(51) Int. Cl.
*G11C 29/36* (2006.01)
*G11C 7/10* (2006.01)
*G11C 29/12* (2006.01)

(52) U.S. Cl.
CPC ............ *G11C 29/36* (2013.01); *G11C 7/1069* (2013.01); *G11C 7/1096* (2013.01); *G11C 29/12005* (2013.01); *G11C 29/12015* (2013.01); *G11C 2029/3602* (2013.01)

(58) Field of Classification Search
None
See application file for complete search history.

(56) References Cited

U.S. PATENT DOCUMENTS

| | | | | |
|---|---|---|---|---|
| 5,404,338 A | * | 4/1995 | Murai ..................... | G11C 7/222 365/233.17 |
| 9,921,763 B1 | * | 3/2018 | Zitlaw ...................... | G11C 7/22 |
| 10,393,803 B2 | | 8/2019 | Wilmoth | |
| 2004/0003331 A1 | * | 1/2004 | Salmon ............... | G06F 13/4243 714/738 |
| 2005/0276261 A1 | * | 12/2005 | Kim ...................... | H04L 5/1438 370/389 |
| 2013/0111256 A1 | * | 5/2013 | Kim ...................... | H03L 7/0814 713/501 |
| 2014/0192583 A1 | * | 7/2014 | Rajan ...................... | G11C 7/10 365/63 |
| 2017/0003889 A1 | * | 1/2017 | Kim ...................... | G06F 3/0659 713/300 |
| 2019/0065111 A1 | * | 2/2019 | Lea ........................ | G06F 3/0673 |
| 2021/0406206 A1 | * | 12/2021 | Vergis ................. | G06F 13/1668 |

OTHER PUBLICATIONS

U.S. Appl. No. 17/682,837, filed Feb. 28, 2022, Christian N. Mohr.

* cited by examiner

*Primary Examiner* — J. H. Hur
(74) *Attorney, Agent, or Firm* — Fletcher Yoder, P.C.

(57) ABSTRACT

A memory device may include sideband circuitry to provide additional functionality without interfering with normal operations of the memory device. The memory device may also include sideband pins to provide sideband information to an external device. The sideband information may include various digital or analog signals. In some cases, a sideband circuit of the memory device may use a data protocol for communicating the sideband information with the external device. Furthermore, systems and methods for receiving sideband information from multiple memory devices of a memory system are described to reduce latency and increase functionality of a memory system including such memory devices.

30 Claims, 5 Drawing Sheets

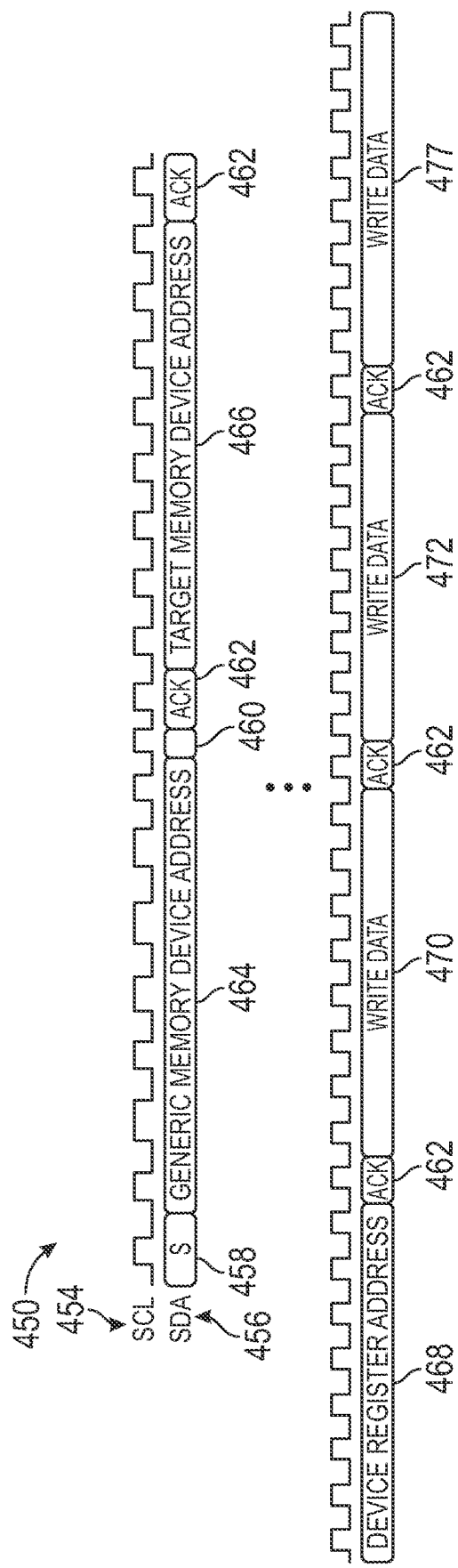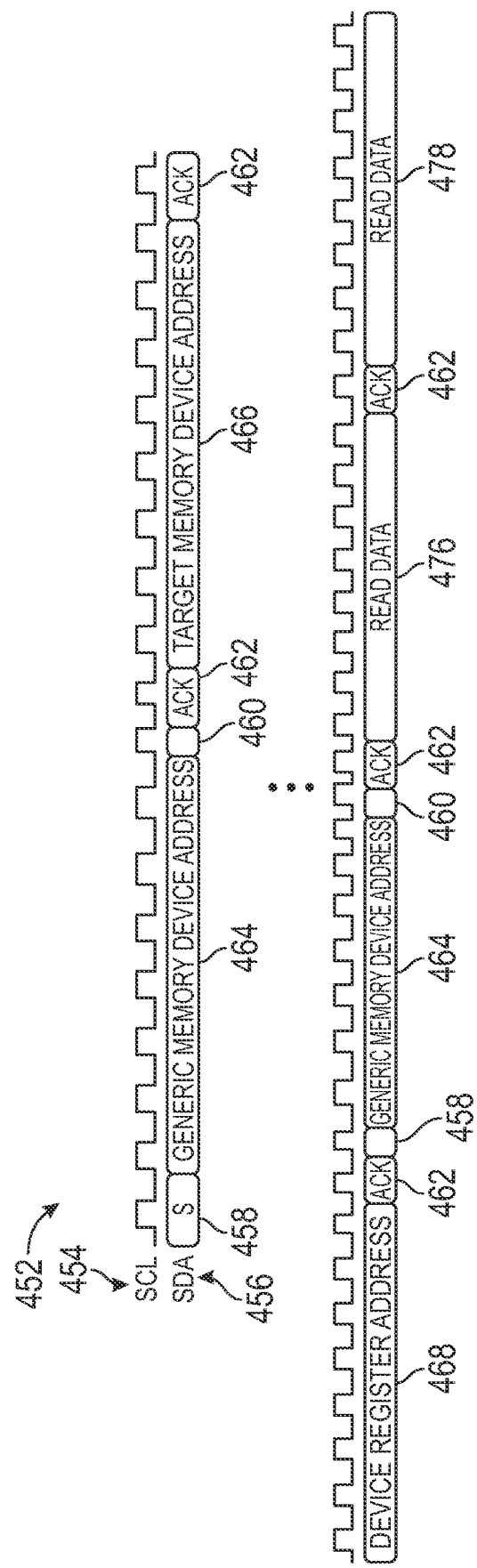

MEMORY DEVICE SIDEBAND SYSTEMS AND METHODS

BACKGROUND

The present disclosure relates generally to memory devices and, more particularly, to monitoring operation of a memory device.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a computing system may include electronic devices that, in operation, communicate information via electrical signals. For example, a computing system may include a processor communicatively coupled to a memory device, such as a dynamic random-access memory (DRAM) device implemented on dual in-line memory module (DIMM). Accordingly, the processor may retrieve executable instructions, retrieve data to be processed by the processor, and/or store data output from the processor on the memory device.

To facilitate improving operational reliability, operation of the memory device may be monitored by a memory controller. The memory controller may facilitate debugging operations of the memory device and/or performing diagnostics on operations of the memory device. In some cases, the memory controller may monitor operations of the memory device based on analysis of signals indicative of data input to and/or output from the memory device. Moreover, the memory controller may provide information related to the operations of the memory device to the processor.

BRIEF DESCRIPTION OF THE DRAWINGS

Various aspects of this disclosure may be better understood upon reading the following detailed description and upon reference to the drawings in which:

FIG. 6A is a timing diagram of the test operation of FIG. 5 performing sideband write operations, in accordance with an embodiment; and FIG. 6B is a timing diagram of the test operation of FIG. 5 performing sideband read operations, in accordance with an embodiment.

DETAILED DESCRIPTION

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Figure 1:
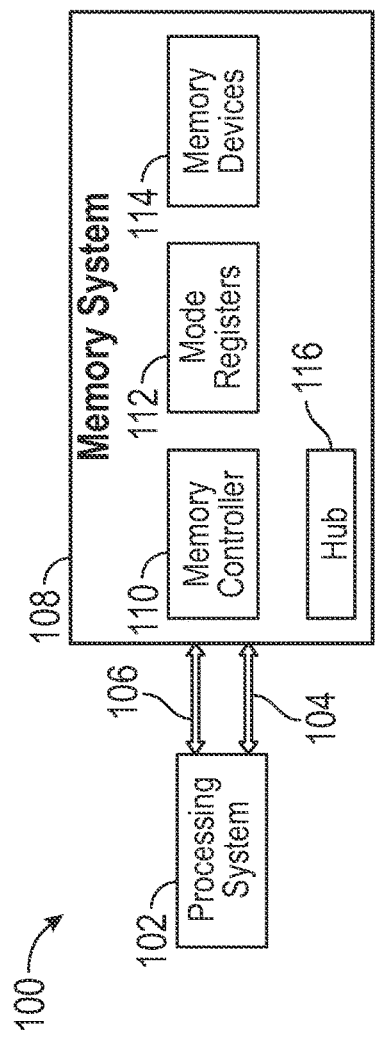
FIG. 1 is a block diagram of a computing system including a processing system and a memory system coupled via a system bus and a sideband bus, in accordance with an embodiment.

FIG. 1 depicts a computing system 100 including a processing system 102 (e.g., a host system, a host chipset) coupled to a memory system 108 via a system bus 104 and a sideband bus 106. The computing system 100 may be any suitable computing product, such as a handheld computing device, a tablet computing device, a notebook computing device, and the like. It should be appreciated that the depicted computing system 100 is merely intended to be illustrative and not limiting.

The processing system 102 may include one or more processors, one or more general purpose microprocessors, one or more application specific processors (ASICs), one or more field programmable gate arrays (FPGAs), or any combination thereof. In some embodiments, the processing system 102 may perform at least a portion of operations of the computing system 100 based on communicating data with the memory system 108 via the system bus 104. For example, the processing system 102 may instruct performing operations (e.g., memory operations) such as retrieving data stored in the memory system 108 (e.g., read operation) or storing data on the memory system 108 (e.g., write operation) via the system bus 104.

Moreover, the processing system 102 may monitor the operations of the memory system 108 via the sideband bus 106. For example, the processing system 102 may monitor operation of the memory system 108 based on communicating status information with the memory system 108 using the sideband bus 106, as will be appreciated. The memory system 108 and the processing system 102 may communicate information using electrical signals (e.g., digital and/or analog signals) via the sideband bus 106.

In some cases, the sideband bus 106 may facilitate communication between a system management bus (SMBus) of the processing system 102 and various components of the memory system 108. In the depicted embodiment, the memory system 108 may include a memory controller 110, mode registers 112, and a number of memory devices 114. In some embodiments, the depicted components of the memory system 108 may be combined into fewer components or separated into additional components.

In some cases, the memory system 108 may include a Dual In-line Memory Module (DIMM), a Random Access Memory (RAM), among other things. Moreover, the memory devices 114 may include a number of Double Data Rate memory (e.g., DDR, DDR5, DDR6, etc.) devices, Single Data Rate memory (e.g., SDR) devices, a combination of both, or other types of memory devices. The memory devices 114 may each include a number of memory banks. Each memory bank, in turn, may include a number of memory arrays. Moreover, the memory arrays may each include multiple memory cells arranged in a number of rows and columns to store information.

The memory controller 110 of the memory system 108 may perform at least some operations of the memory devices 114. Moreover, in some cases, some of the memory devices 114 may include a dedicated memory controller 110 to control at least some operations of the respective memory devices 114. For example, the memory controller 110 may facilitate translating communication between the memory banks of the memory devices 114 and the processing system 102.

In some cases, the memory controller 110 may include a Serial Presence Detect (SPD) device and/or a hub 116 to translate communication between the processing system 102 and different components of the memory system 108 (e.g., the mode registers 112, the memory devices 114, etc.). Additionally or alternatively, the memory system 108 may include a standalone hub 116 device (or chip) to facilitate the communication between the processing system 102 and different components of the memory system 108.

The memory controller 110 may facilitate performing some of the operations of the memory devices 114 based on receiving instructions from the processing system 102. Such instructions may include instructions to perform one or more write operations, one or more read operations, and/or monitoring some aspects of the memory system 108. In some cases, monitoring the memory system 108 may include providing an indication of one or more conditions of the memory system 108, providing an indication of one or more conditions of one or more target memory devices 114, and/or providing an indication of data associated with the one or more target memory devices 114.

For example, the one or more conditions of the memory devices 114 may include an analog voltage level, a temperature, and/or a power consumption value of the one or more target memory devices. Moreover, the indication of the data associated with the target memory devices 114 may include test data and/or status of the write operations and/or read operations of the target memory devices 114. The test data may include synchronous memory test operation, asynchronous memory test operation, among other test information, to monitor operations of one or more of the memory devices 114.

In any case, at least some of the memory devices 114 may include sidebands (e.g., sideband circuitry) performing sideband operations based on the operation modes of the memory system 108 and/or operation modes of the respective memory devices 114. In some cases, the sideband circuitry of a memory device 114 may include a number of pins. For example, the sideband circuitry may provide information related to normal operations of the respective memory device 114. Moreover, in specific cases, the sideband circuitry may provide the information concurrent to performing the normal operations of the respective memory device 114. In any case, the sideband circuitry may include communication circuitry that may provide the information based on a data communication protocol, such as Inter-Integrated Circuit (I2C) and/or an Improved Inter-Integrated Circuit (I3C), as will be appreciated.

For example, the mode registers 112 may receive data indicative of the operation modes of the memory system 108 from the processing system 102 via the system bus 104 and/or the sideband bus 106. In some cases, the mode registers 112 may receive such data from the memory controller 110. Alternatively or additionally, in specific cases, the memory system 108 may include one or more fuses to set an operation mode of the memory system 108 before a runtime of the memory system 108 by blowing the fuse.

The operation modes of the memory devices 114 (and/or the memory system 108) may include, for example, a normal mode, a loopback mode, and/or a sideband mode. In some embodiments, the mode registers 112 may store data indicative of operation modes of the memory system 108. For example, the mode registers 112 (or the fuses) may indicate the operation modes to the memory controller 110, the memory devices 114, and/or the processing system 102.

In the normal mode, the memory system 108 may communicate data with the processing system 102. For example, the memory devices 114 may perform read and/or write operations over the system bus 104 when operating in the normal mode. In the sideband mode, the memory system 108 may communicate sideband information, including digital and/or analog signals, associated with one or more operations of the target memory devices 114 with the processing system 102. Moreover, in some cases, at least some of the memory devices 114 may operate in the normal mode and the sideband mode (and/or loopback mode) simultaneously based on communicating using the system bus 104 and the sideband bus 106.

For example, in the sideband mode, the processing system 102 may request returning test data and/or status of the write operations and/or read operations of the target memory devices 114. In some cases, the test data may include status of a read/write operation (e.g., operation completed, operation in progress, operation start, etc.), a portion of the data stored on the memory devices 114, a portion of the data communicated by a target memory device 114 in the normal mode (e.g., every other read or written data, every fourth read or written data, every eighth read or written data, and so on), and/or other information associated with the target memory devices 114. Moreover, in specific cases, the memory system 108 may provide the sideband information without receiving a request from the processing system 102.

In any case, when operating in the normal mode and the sideband mode, the target memory devices 114 may provide the sideband information to the processing system 102 via the sideband bus 106 without interfering with read/write operation of the target memory devices 114 on the system bus 104. As mentioned above, in some cases, the sideband bus 106 may couple various components of the memory system 108 to the SMBus of the processing system 102 via the hub 116. Accordingly, the memory system 108 may operate in the normal mode and the sideband mode simultaneously.

For example, the memory system 108 may communicate the data associated with the read and/or write operations via the system bus 104 and communicate the sideband information associated with the test operations via the sideband bus 106. Moreover, the memory system 108 may communicate the data via the system bus 104 in parallel to (and/or simultaneous to) communicating the sideband information via the sideband bus 106.

As mentioned above, the target memory devices 114 may provide the sideband information including test data, stored data, temperature data, and status information of the memory device operations, analog voltage levels associated with the target memory devices, among other information. Moreover, the processing system 102 may provide write data to the target memory devices 114 via the sideband bus 106. For example, the processing system 102 may provide one or more countermeasures (e.g., commands) via the sideband bus 106 in response to receiving the sideband information.

With the foregoing in mind, the system bus 104 and the sideband bus 106 may each include a number of data buses for data communication. Moreover, the system bus 104 may include a limited bandwidth for communicating data between the processing system 102 and the memory system 108. Accordingly, in some cases, communicating the sideband information using the sideband bus 106 may reduce the data traffic of the system bus 104, increase available bandwidth of the system bus 104, reduce a latency in providing the data and/or the sideband information to the processing system 102, and/or increase functionality of the memory devices 114. As such, the processing system 102 may monitor the read and/or write operations of the memory system 108 based on communicating the sideband information via the separate sideband bus 106.

Figure 2:
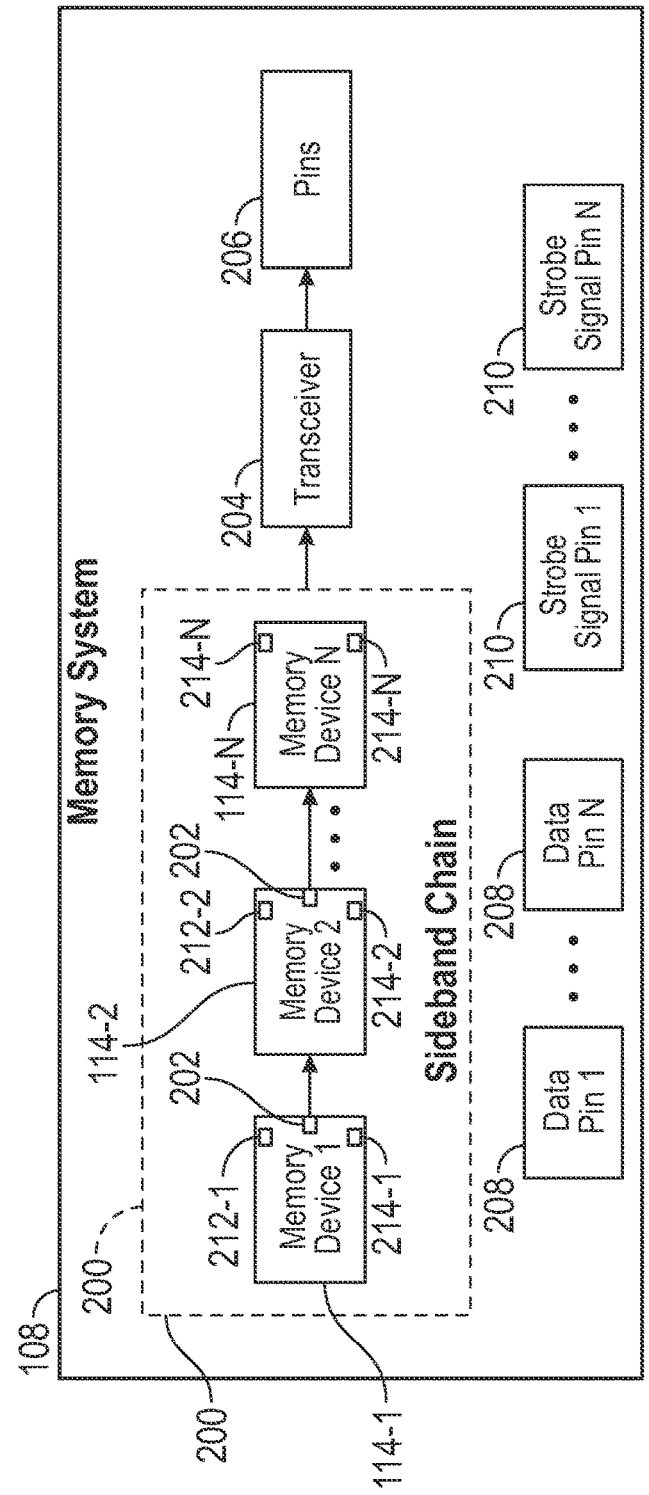
FIG. 2 is a block diagram of the memory system of the computing system of FIG. 1 including a multi-drop bus, a transceiver, and sideband pins to facilitate communication via the sideband bus of FIG. 1, in accordance with an embodiment.

FIG. 2 depicts a block diagram of the memory system 108 including the memory devices 114 coupled to a multi-drop bus 200 to provide the sideband information. In some cases, when the memory system 108 include a loopback chain, the multi-drop bus 200 may include the loopback chain. In some embodiments, the multi-drop bus 200 may couple the memory devices 114 in series. For example, in the depicted embodiment, the multi-drop bus 200 may couple a first memory device 114-1, a second memory device 114-2, and other memory devices 114-N in series.

Moreover, some of the memory devices 114 may couple to the multi-drop bus 200 via respective sideband pins 202 of the memory device 114. In specific cases, when multi-drop bus 200 includes the loopback chain, the sideband pins 202 may include loopback pins. For example, the loopback pins may be pre-existing in at least some of the memory devices 114 of a memory system 108 where the sideband mode is being implemented. Alternatively or additionally, the sideband pins 202 may be dedicated and separate pins to provide the sideband information. Furthermore, in specific cases, the multi-drop bus 200 may include a sideband signal path and a sideband strobe signal path to provide a sideband signal with a sideband strobe signal. For example, the sideband pins 202 of the memory devices 114-1, 114-2, and/or 114-N may each include a sideband pin and a sideband strobe pin coupled to the sideband signal path and the sideband strobe signal path to provide the sideband signal and the sideband strobe signal.

The memory system 108 may also include a transceiver 204, one or more pins 206, one or more data pins 208, and one or more strobe signal pins 210. It should be appreciated that the depicted memory system 108 is merely intended to be illustrative not limiting. For example, the pins 206 may include a memory system sideband pin and a memory system sideband strobe pin for external communication of the sideband information. Moreover, the memory system 108 may include multiple (e.g., two) multi-drop buses 200 coupled to the transceiver 204. Alternatively or additionally, the memory system 108 may also include multiple transceivers 204.

In the normal mode, the memory system 108 may provide an external device (e.g., the processing system 102) access to the memory devices 114 via the data pins 208 and the strobe signal pins 210. For example, the memory controller 110 may instruct the memory system 108 to receive data for storage or provide stored data from the memory devices 114 using the data pins 208 and the strobe signal pins 210. The memory system 108 may communicate the data with the external device via the data pins 208 and the strobe signal pins 210. For example, the memory system 108 may communicate the data with the processing system 102 via the system bus 104, discussed above, through the data pins 208 and the strobe signal pins 210.

In the sideband mode, the memory system 108 may provide the external device with access to the memory device 114 using the pins 206, the transceiver 204, and the multi-drop bus 200. In some embodiments, a memory controller of a target memory device 114 may receive instructions from an external device to provide sideband information. For example, the memory controller of the target memory device 114 may provide instructions, internal to the target memory device 114, to return the requested sideband information in response to receiving the instructions from the external device via the multi-drop bus 200 coupled to the sideband pins 202.

The first memory device 114-1 may perform one or more requested test operations, may retrieve test data, and/or may retrieve a status indication when the memory system 108 receives an instruction for performing sideband test operations targeting the first memory device 114-1. In some embodiments, the remaining memory devices 114-2 and 114-N may provide the sideband information subsequent to the first memory device 114-1. For example, each of the remaining memory devices 114-2 and 114-N may provide the sideband information in order and subsequent to the first memory device 114-1 based on a respective counter value.

In some cases, the memory devices 114 may each include a count register 212. The count register 212 of each memory device 114 may indicate when the memory device 114 may provide the sideband information. For example, the count register 212-1 may be reset when the first memory device 114-1 receives the instructions to perform the sideband mode test operations. Accordingly, the first memory device 114-1 may provide the requested sideband information based on resetting the count register 212-1.

Subsequently, a count register 212-2 may indicate providing the sideband information from the memory device 114-2. For example, the count register 212-2 may be set to a value 1 when the first memory device 114-1 receives the instructions. The count register 212-2 may determine an acknowledgement of the target memory device 114-1 providing the sideband information successfully. Moreover, the count register 212-2 may decrement in response to determining the acknowledgement of the target memory device 114-1 providing the sideband information successfully. As such, the second memory device 114-2 may provide the requested sideband information based on the count register 212-1 turning to 0.

Similarly, the memory devices 114-3, 114-4 (not illustrated), and so on, may provide the sideband information in response to the respective count registers 212-3, 212-4 (not illustrated), and so on, detecting an acknowledgement of a previous memory device 114 successfully returning the sideband information. For example, when the first memory device 114-1 receives the instructions, the count register 212-3 may be set to a value 2, the count register 212-4 may be set to a value 3, and so on. The count registers 212-3, 212-4, and so on, may individually track a counter number to loop through the entirety of the memory devices 114 (e.g., in a round robin fashion). Accordingly, the memory devices 114 may loop through the remaining memory devices 114-2, 114-3, and so on, subsequent to returning the sideband information from the target memory device 114-1 unless receiving a stop or reset instruction.

Moreover, it should be appreciated that the described method of decrementing the count registers 212 is by the way of example. In different embodiments, alternative or additional components and/or methods may be used to cause the remaining memory devices 114-2 and 114-N to provide the sideband information subsequent to the first memory device 114. Moreover, in different embodiments, the remaining memory devices 114-2 and 114-N may provide the sideband information in a different order. For example, the remaining memory devices 114-2 and 114-N may provide the sideband information based on a position of the memory devices 114 on the multi-drop bus 200.

Each of the memory devices 114 may also include one or multiple status registers 214. In some cases, each of the status registers 214 may be associated with a temperature of the selected memory device 114, an operation status of the selected memory device 114, returning stored data, and/or returning at least a portion of data communication of the selected memory device 114 on the system bus 104 (e.g., read and/or write operations), among other things. For example, the first memory device 114-1 may refer to the status registers 214 to determine and provide the sideband information. In some cases, a memory controller 110 of a memory device 114 may set, reset, or update the status registers with the respective information of the memory device 114.

The target memory device 114 may provide the sideband information (e.g., digital and/or analog signals) by the multi-drop bus 200, the transceiver 204, and the pins 206 to the sideband bus 106. The transceiver 204 may use a data protocol for providing the sideband information to the pins 206 and the external device. In some cases, the transceiver 204 may include an I2C transceiver, an I3C transceiver, among other viable transceivers, for providing the sideband information. For example, when in sideband mode, the memory system 108 may communicate the sideband information with the I2C or I3C data protocol based on operations of the transceiver 204. Accordingly, the transceiver 204 may facilitate communicating the sideband information via the sideband bus 106 in parallel to communicating data via the system bus 104.

When providing the sideband information, the transceiver 204 may receive the sideband information from the memory devices 114 (e.g., the target memory device). For example, the target memory device 114 may provide digital or analog signals indicative of the sideband information to the transceiver 204. Moreover, the target memory device 114 may provide stored data of the status registers 214 indicative of temperature and/or operation status of the target memory devices 114. In some cases, the transceiver 204 may convert the sideband information using a data communication protocol (e.g., the I2C data protocol, I3C data protocol, etc.). Subsequently, the transceiver 204 may output the sideband information to the sideband bus 106 via the pins 206.

In any case, although certain components are shown with respect to the memory system 108, it should be appreciated that the memory system 108 may include other components as well. Moreover, in different embodiments, the memory system 108 may include different components for providing the data and the sideband information of the memory devices 114, the status registers 214, among other components. Moreover, each of the memory devices 114 may include a variety of components and signal paths to provide the sideband information from the respective memory device 114 and/or pass-through sideband information provided by other memory devices 114 positioned on the multi-drop bus 200 to the pins 206. In specific cases, the pass-through sideband information may be transmitted using loopback circuitry of the memory devices 114. Alternatively or additionally, the pass-through sideband information may be transmitted using the sideband circuitry of the memory devices 114. For example, each memory device 114 may include a hub 116 mentioned above and discussed in more details below.

Figure 3:
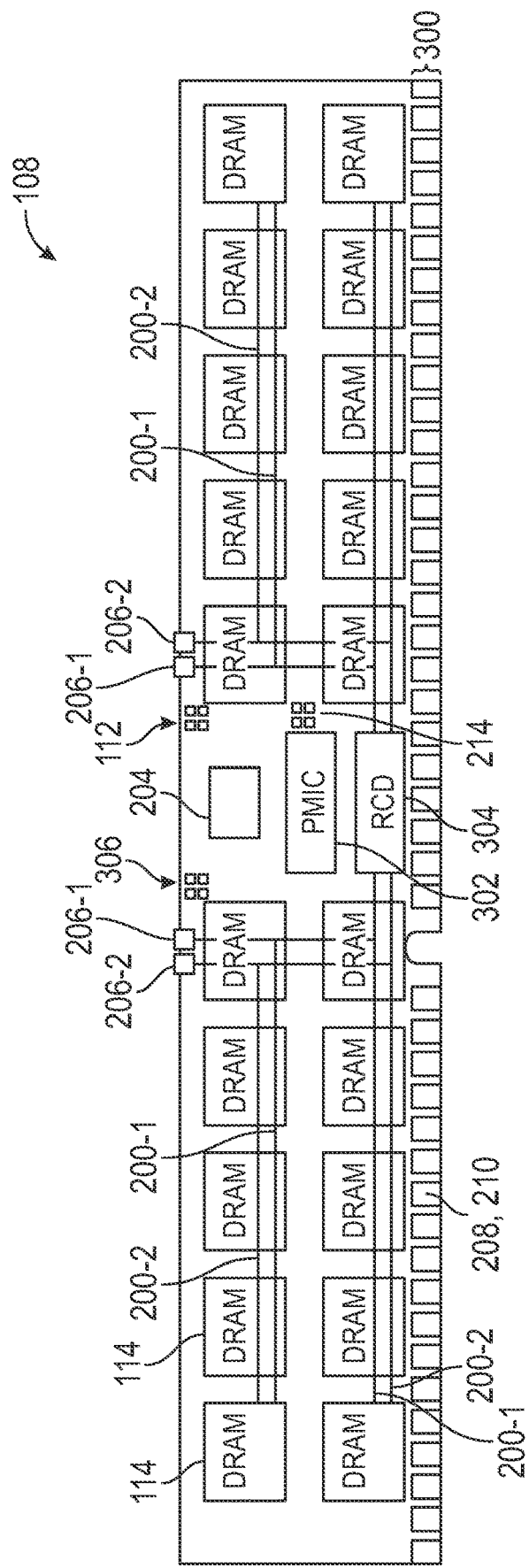
FIG. 3 is a block diagram of an example implementation of the memory system of FIG. 2 on a circuit board, in accordance with an embodiment.

FIG. 3 depicts an embodiment of the memory system 108. For example, the depicted embodiment of the memory system 108 may include a DIMM and/or a RAM device. Although a specific architecture of the memory system 108 is depicted in FIG. 3, it should be appreciated that the depicted embodiment is merely an example and various suitable architectures may be used in different embodiments of the memory system 108. Furthermore, in the depicted embodiment, each of the memory devices 114 may include a dynamic random access memory (DRAM). However, it should be appreciated that in other embodiments, different memory types may be used.

The memory system 108 may be coupled to the computing system 100 of FIG. 1 via an edge connector 300. The edge connector 300 may couple to or include a number of data pins 208 and/or strobe signal pins 210. Moreover, the edge connector 300 may couple to the system bus 104. Accordingly, the memory system 108 may communicate data with external devices in normal mode via the data pins 208 and/or strobe signal pins 210 via the edge connector 300. For example, the memory system 108 may use the edge connector 300 for communicating data when performing the read and/or write operations in the normal mode.

In the depicted embodiment, the memory system 108 may include a power management integrated circuit (PMIC) 302 and a registering clock driver (RCD) 304. The PMIC 302 may control a power supplied to the memory devices 114. The RCD 304 may provide a clock signal to each of the memory devices 114. In some cases, the RCD 304 may provide different clock signals to different memory devices 114 of the memory system 108. Each memory device 114 may perform the normal operations and/or the sideband operations using an operating clock frequency based on a received clock signal from the RCD 304.

The memory system 108 may also include pins 206-1 (e.g., a sideband pin, a loopback (LBDQ) pin) and 206-2 (e.g., a sideband strobe pin, a loopback strobe (LBDQS) pin) accessible to the external devices. For example, the pins 206-1 and 206-2 may couple to the sideband bus 106 of the computing system 100 discussed above. In some cases, the pin 206-1 may provide access to sideband information of a multi-drop bus 200-1 (e.g., loopback data chain). The target memory devices 114 may provide the sideband information using the multi-drop bus 200-1.

Moreover, the pin 206-2 may provide access to sideband strobe data of the multi-drop bus 200-2 (e.g., loopback strobe data chain). In some cases, at least some of the target memory devices 114 may provide the sideband strobe data using the multi-drop bus 200-2. For example, the memory devices 114 may be coupled in series by the multi-drop buses 200-1 and 200-2. Accordingly, the memory system 108 may provide the sideband information to one or more external devices via the pins 206-1 and 206-2 and through the multi-drop buses 200-1 and 200-2. However, it should be appreciated that routing of the multi-drop buses 200-1 and 200-2 on the memory system 108 may be different and according to a different architecture in other embodiments.

The memory system 108 may also include the transceiver 204. As discussed above, the transceiver 204 may facilitate communication between the memory system 108 and one or more external devices (e.g., the processing system 102). The transceiver 204 may receive the sideband information of the memory devices 114 via the multi-drop buses 200-1 and 200-2. The transceiver 204 may convert the received sideband data according to a data protocol. Moreover, the transceiver 204 may provide the converted sideband data to the external devices through the sideband pin 206-1 and the sideband strobe pin 206-2 according to the data protocol.

In some cases, the transceiver 204 may translate the data for communication between the memory devices 114 and the external devices based on the I2C data protocol and/or the I3C data protocol, among other communication protocols. For example, the transceiver 204 may include an I2C transceiver and/or an I3C transceiver. Alternatively or additionally, the transceiver 204 may use other viable data protocols for communicating sideband information via the pins 206 and the sideband bus 106 shown in FIG. 1.

The transceiver 204 may also receive data provided using a data protocol from the external devices. The transceiver 204 may convert the received data and provide the converted data to one or more targeted memory devices 114, the memory controller 110, or any other receiving component of the memory system 108. For example, the transceiver 204 may convert the data received using the I2C data protocol or I3C data protocol to data using an internal data protocol of the memory devices 114. In some cases, the received data may also set the operation mode (e.g., normal mode, sideband mode, loopback mode, or a combination thereof) of the memory devices 114, for example, based on setting or resetting one or more of the mode registers 112.

In some embodiments, the received data may set the operation mode of the memory system 108 to the normal mode, the sideband mode, the loopback mode, or a combination thereof, by setting the respective values of the respective mode registers 112. Alternatively or additionally, the memory system 108 may use fuses 306 for setting the operation modes of the memory system 108 in the normal mode, the sideband mode, or both. In such cases, the fuses 306 may be blown during manufacturing or before operation of the memory system 108 to indicate the operation modes of the memory system 108.

In any case, the received data may instruct the memory controller 110 to retrieve requested sideband information, or perform other operations. An example operation of the memory system 108 using the transceiver 204 is described below with respect to FIGS. 5, 6A, and 6B. Moreover, it should be appreciated that the processing system 102 may couple to the pins 206 to monitor operations of the memory system 108 via the sideband bus 106 through any viable means of coupling such as one or more cables, one or more connectors, or one or more data pins 208 and/or strobe signal pins 210 coupled to the edge connector 300.

Figure 4:
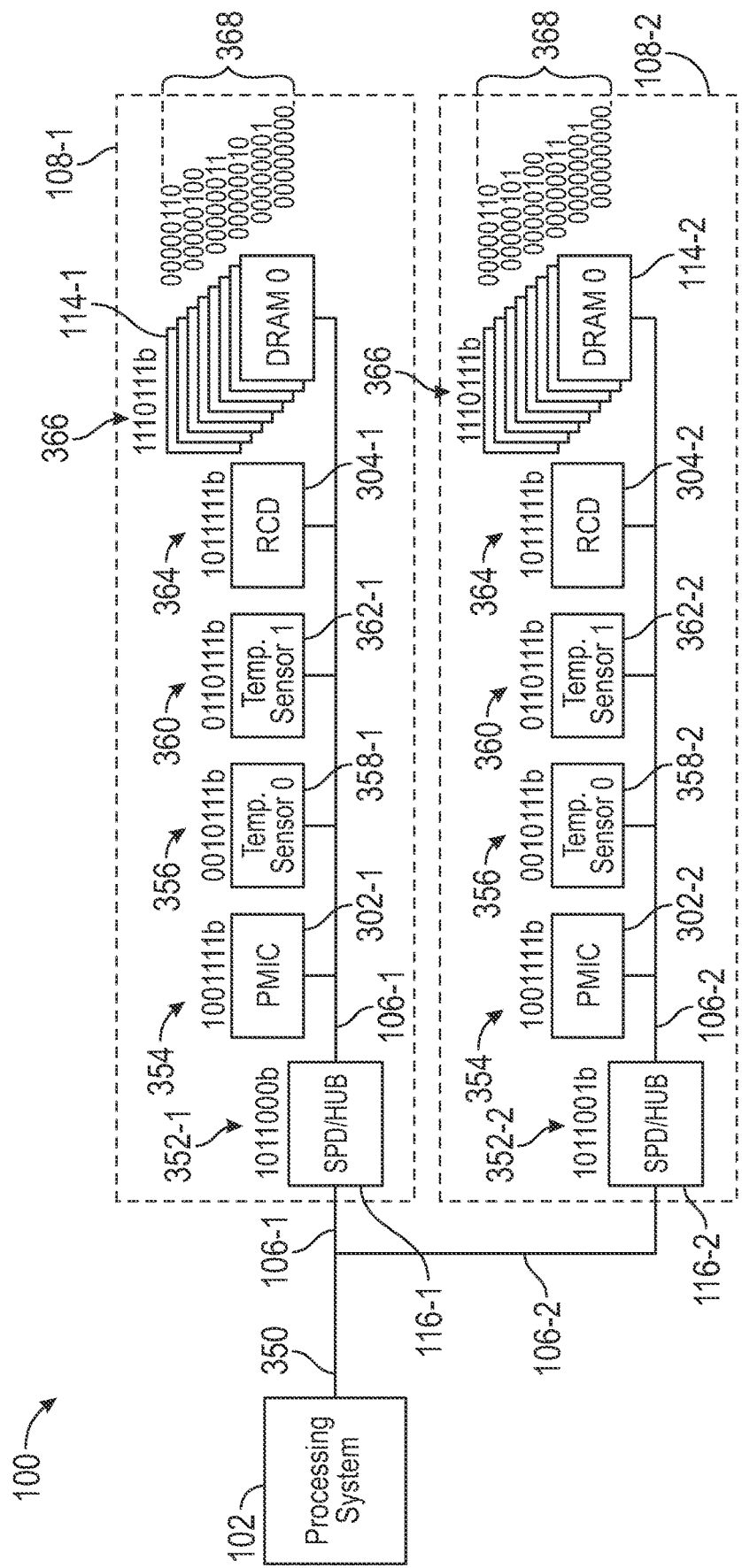
FIG. 4 is a block diagram of an example implementation of multiple memory systems of FIGS. 1-3 in a computing system, in accordance with an embodiment.

FIG. 4 depicts the computing system 100 including a memory system 108-1 and a memory system 108-2 coupled to the processing system 102. The memory systems 108-1 and 108-2 may each include a DIMM or RAM, among other things. For example, each of the memory systems 108-1 and 108-2 may refer to the memory system 108 discussed above with respect to FIGS. 1-3.

In the depicted embodiment, a perspective view of the memory systems 108-1 and 108-2 are depicted illustrating the sideband buses 106-1 and 106-2 respectively. It should be appreciated that although the sideband buses 106-1 and 106-2 are shown to be coupled to certain components of the memory systems 108-1 and 108-2, the sidebands buses 106-1 and 106-2 may couple to other components in additional or alternative embodiments. Moreover, in different cases, the memory systems 108-1 and 108-2 may include additional components or omit some of the depicted components.

The sideband buses 106-1 and 106-2 of the memory systems 108-1 and 108-2 may couple to a SMBus 350 of the processing system 102. The processing system 102 may provide a first address byte selecting between the memory systems 108-1 and 108-2. For example, a hub 116-1 of the memory system 108-1 may be associated with an address 352-1 and a hub 116-2 of the memory system 108-2 may be associated with an address 352-2. For example, the processing system 102 may provide a first address byte including the address 352-1 to select the memory system 108-1. Alternatively, the processing system 102 may provide the first address byte including the address 352-2 to select the memory system 108-2.

The processing system 102 may provide the first address byte indicative of a second address byte. In some cases, the hub 116-1 may translate the first address byte to provide the second address byte. Accordingly, based on receiving the first address byte, the hub 116-1 may provide the second address byte to select at least one of the components of the memory system 108-1. For example, the hub 116-1 may provide an address byte 354 to select the PMIC 302-1, an address byte 356 to select a temperature sensor 358-1, an address byte 360 to select a temperature sensor 362-1, an address byte 364 to select the RCD 304-1, or an address byte 366 to select the memory devices 114-1. The memory system 108-2 may include similar addresses for the respective components when selected.

For example, the hub-116-1 may provide the second address byte including the address byte 366 to select the memory devices 114-1 of the selected memory system 108-1. Each of the addresses 368 may correspond to a memory device 114 of the memory devices 114-1. When the memory devices 114 of the memory system 108-1 are selected, the processing system 102 may provide a third byte including one of the addresses 368 for selecting a respective memory device 114 among the memory devices 114-1. For example, the processing system 102 may provide the data bytes (e.g., the first byte, second byte, and the third byte) based on the I2C data protocol and/or I3C data protocol, among other viable data protocols.

In some cases, based on selecting a memory device 114 of the memory system 108-1, the processing system 102 may provide a fourth byte selecting one or more of the status registers 214 of the selected memory device 114. As mentioned above, the status register 214 may be associated with a temperature of the selected memory device 114, an operation status of the selected memory device 114, returning stored data, and/or returning at least a portion of data communication of the selected memory device 114 on the system bus 104 (e.g., read and/or write operations). Subsequently, the selected memory device 114 may return the requested sideband information, for example, based on the selected status registers 214. For example, the sideband information may include digital data (e.g., one or more data bytes) or an indication of an analog signal provided over a timeframe.

In some cases, the memory devices 114 of the selected memory system 108-1 (and/or the memory system 108-2) may each include the count registers 212 to track a counter number. Accordingly, the memory devices 114 may loop through the remaining memory devices 114 subsequent to returning the sideband information from the selected memory device 114. As mentioned above, the memory devices 114 may stop providing the sideband information from subsequent memory devices 114 upon receiving a stop or reset instruction.

Figure 5:
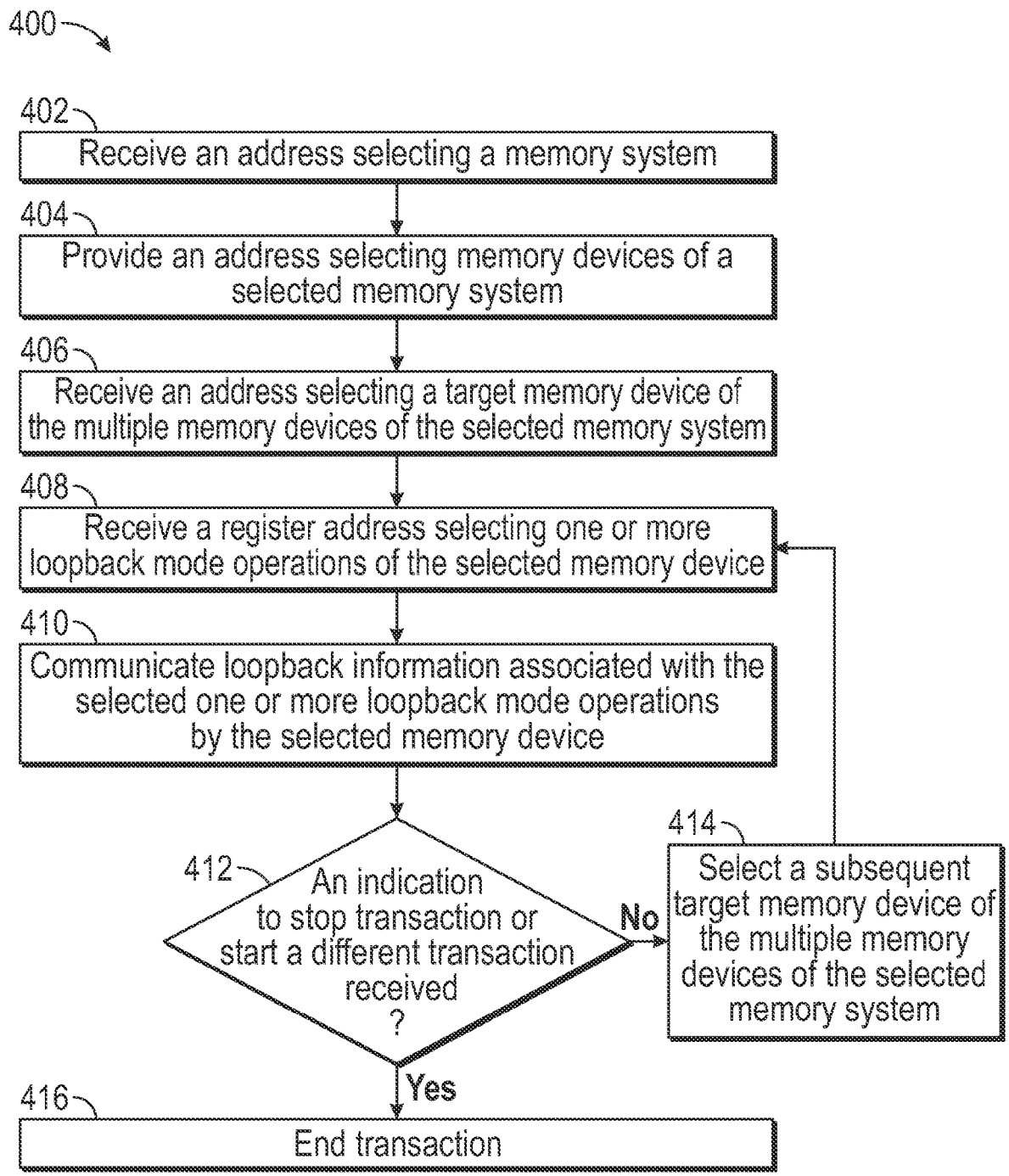
FIG. 5 is a flow diagram of a test operation of the memory system of FIG. 2 that provides information from a target memory device and subsequent memory devices to the processing system via the sideband bus, in accordance with an embodiment.

FIG. 5 depicts a process 400 for performing memory test operations using the memory system 108 described above. It should be appreciated that although the process blocks of FIG. 5 are described in a particular order, the process blocks may be performed in a different order, one or multiple process blocks may be omitted, and/or additional process blocks may be added.

In some cases, the memory controller 110 of the memory devices 114 or the memory system 108 may facilitate performing the memory operations based on process blocks discussed below. For example, the hub 116 of the memory system 108 may provide the commands (e.g., data bytes and analog signals) between the memory system 108 and the processing system 102. Moreover, the process 400 of FIG. 5 may be described with respect to example timing diagrams 450 and 452 of FIGS. 6A and 6B, respectively.

FIG. 6A depicts the timing diagram 450 associated with writing the loopback information on a selected (or targeted) memory device 114. Moreover, FIG. 6B depicts a timing diagram 452 associated with reading (e.g., returning) the sideband information from the selected memory device 114. For example, the timing diagrams 450 and 452 may be associated with an I2C or I3C communication protocol using the multi-drop bus 200, the transceiver 204 (e.g., an I2C or I3C transceiver), and the pins 206 discussed above. The transceiver 204 may translate the communication between the memory devices 114 and the processing system 102.

The memory system 108 may receive data signal (SDA) 456 based on a clock signal (SCL) 454 of the sideband bus 106. For example, the memory system 108 may clock-in (or clock-out) the SDA 456 based on the SCL 454 clock cycles. In some cases, the processing system 102 may provide the SCL 454 and the SDA 456 via the SMBus 350 illustrated in FIG. 4 above. Moreover, in specific cases, the test operations of the sideband mode may be performed simultaneous and/or in parallel with the read and/or write operations of the normal mode based on using sidebands of the memory devices 114 with the transceiver 204 and the sideband bus 106 for communicating data.

Referring back to FIG. 5, at block 402, the memory controller 110 may receive an address selecting the memory system 108 (e.g., the memory system 108-1 or the memory system 108-2). For example, the selected memory system 108 may start a transaction or operation based on receiving the address via a respective sideband bus 106. As mentioned above, the memory controller 110 may be any host device on the sideband bus, such as a memory controller of a memory device 114, a memory controller of another memory device 114, or a memory controller of the memory system 108.

For example, the memory system 108 may receive an indication to start a transaction based on receiving one or more start bits 458 of FIGS. 6A and 6B. Moreover, the memory system 108 may receive an address selecting the memory devices 114 combined with one or more mode bits selecting a write operation mode.

Subsequently, at block 404, the memory system 108 may provide an address selecting the memory devices 114 of the selected memory system 108. For example, the hub 116 (or the memory controller 110) may provide the address to select the memory devices 114 subsequent to receiving the memory device address and one or more mode bits at block 402. In some embodiments, the operations of block 404 may apply when multiple memory systems 108 are connected to the host 102 via the hub 116. In such embodiments, operations of block 404 may be bypassed when only one memory system operations.

In FIGS. 6A and 6B, the address associated with the memory devices 114 is illustrated by a generic memory device address 464 for the write mode operation. The memory system 108 may also receive one or more mode bits 460 selecting a write operation mode. In the depicted embodiment, the memory system 108 may provide an acknowledgement 462 in response to receiving (e.g., correctly receiving) generic memory system address bits 460. For example, the memory system 108 may provide the acknowledgement 462 in response to correctly receiving subsequent data bits and/or data bytes as well.

At block 406, the memory system 108 may receive an address selecting a target memory device 114 of the multiple memory devices 114 of the selected memory system 108. For example, the memory controller 110 and/or the hub 116 may receive and provide the address to the target memory device 114. As illustrated in FIGS. 6A and 6B, target memory device address 466 is provided after the generic memory device address 464 indicative of write mode operation is received. The target memory device 114 may be activated or otherwise become ready for receiving subsequent instructions upon detecting the target memory device address 466.

At block 408, the memory system 108 may receive a register address selecting one or more sideband mode operations of the selected memory device 114. For example, the sideband mode operations may include providing test data associated with storing data received from the processing system 102, providing stored data on the memory system 108, providing a temperature of the memory system 108, providing an analog supply voltage level of the memory system 108, providing a state of an data in/out oscillator (DQS oscillator) of the memory system 108, providing a current state of one or more input/output calibration buffers of the memory system 108, among other information.

In FIGS. 6A and 6B, a device register address 468 may illustrate the received register address. For example, the device register address 468 may correspond to one or more of the status registers 214 of the selected memory device 114. In some cases, all the memory devices 114 may receive the device register address 468 for continuously performing the sideband mode operations subsequent to the selected memory device 114. Alternatively, the remaining memory devices 114 may receive the device register address 468 in order and subsequent to the selected memory device 114 to perform the one or more sideband mode operations continuously. In any case, the selected memory device 114 may activate the one or more status registers 214 to perform the one or more sideband mode operations based on receiving the device register address 468.

At block 410, the selected memory device 114 may communicate sideband information of the selected one or more sideband mode operations by the selected memory device 114. In some cases, the selected memory device 114 may communicate the sideband information based on the activated one or more of status registers 214. Moreover, communicating sideband information may include writing data onto a storage element of the selected memory device 114, returning an indication of stored data on the selected memory device 114, and/or providing an indication of one or more analog voltage levels. Referring to FIG. 6A, when the device register address 468 is indicative of writing data, the selected memory device 114 may store a write data 470 received via the sideband bus 106.

At block 412, the selected memory device 114 may determine whether an indication to stop the transaction or start a different transaction is received. When no indication to stop the transaction or start a different transaction is received, at block 414, the selected memory device 114 may select a subsequent target memory device 114 of the multiple memory devices 114 of the selected memory system 108. As mentioned above, a count register 212 of each memory device 114 may track sideband mode operations by each memory device 114 to facilitate providing the sideband information of the remaining memory devices 114 subsequent to the selected memory device 114. Referring to FIG. 6A, when the device register address 468 is indicative of writing data, a subsequent memory device 114 may receive and store a subsequent write data 472.

For example, the count registers 212 reset to an initial value based on starting a transaction at block 402 and/or selecting a target memory device 114 at block 406. Moreover, the count register 212 of each memory device 114 may increment or decrement based on detecting the acknowledgement 462, among other possible indications of communicating sideband information by a selected memory device 114. Similarly, a subsequent memory device 114 may receive and store a subsequent write data 474 when no indication to stop the transaction or start a different transaction is received at block 412.

Referring now to FIG. 6B, for performing the read operations, the selected memory device 114 may receive the one or more start bits 458. The one or more start bits 458 may indicate start or restart of a subsequent operation. The selected memory device 114 may subsequently receive another generic memory device address 464 indicative of read mode operation subsequent to receiving the device register address 468. In the depicted embodiment, the selected memory device 114 may receive the one or more mode bits 460 selecting a read operation mode.

As such, the selected memory device 114 may provide a read data 476 via the sideband bus 106. In some cases, a subsequent memory device 114 may provide a subsequent read data 476. Similar to write operations discussed above, the count register 212 of each memory device 114 may track sideband mode operations by each memory device 114 to facilitate providing the sideband information of the remaining memory devices 114 subsequent to the selected memory device 114.

Moreover, the read data may include read information such as stored data bits, informative information encoded using data bits, and/or an indication of analog voltage levels provided over a period of time. Similarly, a subsequent memory device 114 may provide a subsequent read data 476. Alternatively, the operation may terminate at block 416.

Thus, the technical effects of the present disclosure include facilitating improved monitoring of memory device operations. For example, bandwidth and latency of memory devices of a memory system may be improved using the systems and methods discussed above. Moreover, the described systems and methods for providing the sideband information of a memory device using a dedicated sideband may improve operations of a memory system and a computing device based on the improved bandwidth and latency for communicating with the memory devices of the memory system and/or the computing system. Furthermore, such memory devices may provide additional functionality when performing sideband mode write and/or read operations based on using the sideband circuitry.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A memory system comprising:
   a system bus;
   a sideband bus separate from the system bus;
   a memory device configured to couple to one or more external devices via the system bus, wherein the memory device is configured to:
     perform memory operations comprising storing received data from and retrieving stored data to the one or more external devices via the system bus; and
     generate sideband information indicative of a status of the memory operations;
   a memory controller coupled to the memory device and configured to couple to the one or more external devices via the system bus, wherein the memory controller is configured to instruct the memory device to store the received data and retrieve the stored data; and
   a transceiver coupled to the memory device and configured to couple to the one or more external devices via the sideband bus, wherein the transceiver is not coupled to the memory controller, wherein the transceiver is configured to:
     receive a request for the sideband information from the one or more external devices; and
     output the sideband information to the one or more external devices based on the request, wherein the transceiver is configured to output the sideband information via the sideband bus.

2. The memory system of claim 1, wherein the transceiver is coupled to the sideband bus via one or more pins.

3. The memory system of claim 2, wherein the one or more external devices comprise a processing system, wherein the one or more pins are coupled to the processing system via the sideband bus.

4. The memory system of claim 2, wherein the one or more pins comprise a sideband pin and a sideband strobe pin.

5. The memory system of claim 1, wherein the memory device is configured to perform a synchronous memory test operation, an asynchronous memory test operation, or both, to generate the sideband information indicative of an analog voltage level, a temperature, a power consumption of the memory device, or a combination thereof.

6. The memory system of claim 1, comprising one or more status registers configured to store at least a portion of the sideband information, wherein the transceiver is configured to output the at least a portion of the sideband information based on the one or more status registers, wherein the memory device is configured to set and reset a value of the one or more status registers to indicate the at least a portion of the sideband information.

7. The memory system of claim 1, comprising a count register configured to indicate a time associated with outputting the sideband information to the one or more external devices.

8. The memory system of claim 7, wherein the count register is set to a value based on receiving external signals via the transceiver.

9. The memory system of claim 1, comprising one or more mode registers configured to indicate operation modes of the memory device, wherein the operation modes comprise at least a normal mode and a sideband mode.

10. The memory system of claim 9, wherein the normal mode is associated with performing the memory operations and the sideband mode is associated with outputting the sideband information.

11. The memory system of claim 9, wherein the one or more mode registers are set to a value based on receiving external signals via the transceiver.

12. The memory system of claim 1, wherein the one or more external devices comprise processing circuitry.

13. The memory system of claim 1, wherein the memory device comprises a double data rate memory device or a single data rate memory device.

14. The memory system of claim 1, wherein the memory device is configured to output the sideband information based on an inter-integrated circuit (I2C) communication protocol or an improved inter-integrated circuit (I3C) communication protocol.

15. The memory system of claim 1, wherein the transceiver is configured to receive the request via the sideband bus, output the sideband information via the sideband bus, or both concurrent to the memory controller instructing the memory device to store the received data and retrieve the stored data.

16. A memory system, comprising:
a system bus;
a multi-drop bus separate from the system bus;
a plurality of memory devices coupled to the multi-drop bus and the system bus, wherein at least one memory device of the plurality of memory devices is configured to couple to one or more external devices via the system bus, wherein the memory device is configured to:
perform memory operations comprising storing received data from and retrieving stored data to the one or more external devices via the system bus; and
generate sideband information indicative of a status of the memory operations;
a memory controller coupled to the plurality of memory devices and configured to couple to the one or more external devices via the system bus, wherein the memory controller is configured to instruct the memory device to store the received data and retrieve the stored data; and
a transceiver coupled to the plurality of memory devices and configured to couple to the one or more external devices via the multi-drop bus, wherein the transceiver is not coupled to the memory controller, wherein the transceiver is configured to:
receive a request for the sideband information from the one or more external devices; and
output the sideband information to the one or more external devices based on the request, wherein the transceiver is configured to output the sideband information via the multi-drop bus.

17. The memory system of claim 16, wherein the sideband information comprises a portion of the received data or a portion of the stored data.

18. The memory system of claim 16, wherein the one or more external devices comprise a processing system, wherein the processing system is configured to monitor at least one of the memory operations of the at least one memory device based on receiving the sideband information.

19. The memory system of claim 18, wherein the processing system is configured to generate the request indicative of selecting the at least one memory device.

20. The memory system of claim 16, wherein the transceiver is configured to receive the sideband information with a first communication protocol, translate the first communication protocol of the sideband information, and output the sideband information with the translated communication protocol.

21. The memory system of claim 16, wherein the transceiver comprises an inter-integrated circuit (I2C) or an improved inter-integrated circuit (I3C).

22. The memory system of claim 16, wherein the at least one memory device is configured to perform a synchronous memory test operation, an asynchronous memory test operation, or both, to generate the sideband information indicative of an analog voltage level, a temperature, a power consumption of the at least one memory device, or a combination thereof.

23. A computing system, comprising:
a processing system;
a system bus coupled to the processing system;
a sideband bus coupled to the processing system and separate from the system bus; and
a memory system coupled to the system bus and the sideband bus, wherein the memory system comprises:
a plurality of memory devices, wherein a memory device of the plurality of memory devices is coupled to the processing system via the system bus, wherein the memory device is configured to:
perform memory operations comprising storing received data from and retrieving stored data to the processing system via the system bus; and
generate sideband information indicative of a status of the memory operations;
a memory controller coupled to the plurality of memory devices and coupled to the processing system via the system bus, wherein the memory controller is configured to instruct the memory device to store the received data and retrieve the stored data; and
a transceiver coupled to the plurality of memory devices and coupled to the processing system via the sideband bus, wherein the transceiver is not coupled to the memory controller, herein the transceiver is configured to:
receive a request for the sideband information from the processing system; and
output the sideband information to the processing system based on the request, wherein the transceiver is configured to output the sideband information via the sideband bus.

24. The computing system of claim 23, wherein the sideband information comprises a portion of the received data or a portion of the stored data.

25. The computing system of claim 23, wherein the processing system is configured to monitor at least one of the memory operations of the memory device based on receiving the sideband information.

26. The computing system of claim 23, wherein the processing system is configured to generate the request indicative of selecting the memory device.

27. The computing system of claim 23, wherein the transceiver is configured to receive the sideband information with a first communication protocol, translate the first communication protocol of the sideband information, and output the sideband information with the translated communication protocol.

28. The computing system of claim 27, wherein the transceiver comprises an inter-integrated circuit (I2C) or an improved inter-integrated circuit (I3C).

29. The computing system of claim 23, wherein the memory device is configured to perform a synchronous memory test operation, an asynchronous memory test operation, or both, to generate the sideband information indicative of an analog voltage level, a temperature, a power consumption of the memory device, or a combination thereof.

30. The computing system of claim 23, wherein the memory device is configured to output the sideband information in response to receiving the request.

\* \* \* \* \*